United States Patent
Ho et al.

(10) Patent No.: US 6,972,939 B1
(45) Date of Patent: Dec. 6, 2005

(54) METHOD AND APPARATUS FOR A FLOATING WELL RC TRIGGERED ELECTROSTATIC DISCHARGE POWER CLAMP

(75) Inventors: Fu-Hing Ho, San Francisco, CA (US); Patrick J. Crotty, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 10/871,075

(22) Filed: Jun. 18, 2004

(51) Int. Cl.[7] .............................. H02H 9/00; H02H 3/22
(52) U.S. Cl. .......................................... 361/56; 361/111
(58) Field of Search ......................... 361/91.1, 56, 111; 257/173, 355, 356; 327/534, 535

(56) References Cited

U.S. PATENT DOCUMENTS

| | | | | |
|---|---|---|---|---|
| 5,463,520 A | * | 10/1995 | Nelson ......................... | 361/56 |
| 5,610,791 A | * | 3/1997 | Voldman ........................ | 361/56 |
| 5,686,751 A | * | 11/1997 | Wu .............................. | 257/356 |
| 5,811,857 A | * | 9/1998 | Assaderaghi et al. ......... | 257/355 |
| 5,838,047 A | * | 11/1998 | Yamauchi et al. ............ | 257/372 |
| 5,892,260 A | * | 4/1999 | Okumura et al. ............. | 257/347 |
| 5,917,365 A | * | 6/1999 | Houston ........................ | 327/534 |
| 6,069,782 A | * | 5/2000 | Lien et al. .................... | 361/111 |
| 6,072,676 A | * | 6/2000 | Tran et al. .................... | 361/56 |
| 6,111,455 A | * | 8/2000 | Eleyan et al. ................. | 327/537 |
| 6,404,269 B1 | * | 6/2002 | Voldman ....................... | 327/534 |
| 6,515,534 B2 | * | 2/2003 | Dabral .......................... | 327/534 |
| 6,552,886 B1 | * | 4/2003 | Wu et al. ...................... | 361/56 |

* cited by examiner

*Primary Examiner*—Brian Sircus
*Assistant Examiner*—Z Kitov
(74) *Attorney, Agent, or Firm*—LeRoy D. Maunu

(57) ABSTRACT

An Electrostatic Discharge (ESD) protection circuit activates an ESD conduction circuit in response to an ESD event. A deactivation circuit generates an exponentially increasing deactivation signal in response to the ESD event, such that once the deactivation signal has increased to a trigger point of a control circuit, the ESD conduction circuit is deactivated. An active resistance component within the deactivation circuit incorporates a biasing element to maintain a resistance value of the active resistance component substantially constant over all operating conditions.

12 Claims, 4 Drawing Sheets

METHOD AND APPARATUS FOR A FLOATING WELL RC TRIGGERED ELECTROSTATIC DISCHARGE POWER CLAMP

FIELD OF THE INVENTION

The present invention generally relates to Electrostatic Discharge (ESD) protection circuits, and more particularly to ESD protection circuits exhibiting RC trigger circuits that reduce adverse body effects.

BACKGROUND

Electrostatic discharge (ESD) is a common occurrence in everyday life. While walking along a carpeted floor in a dry, heated room, for example, enough static electricity is stored within the human body to provide quite a shocking experience when contact is made with another object. Such a contact allows the stored static electricity to suddenly discharge from the human body into the contacted object. While this sudden discharge of static electricity may be of no harm to human bodies, it can be very damaging to electronic devices which are sensitive to ESD.

When an electrostatically charged person or object touches, or comes within sufficient proximity to, an ESD sensitive device, there is a possibility that the electrostatic charge can be discharged through circuitry contained within the ESD sensitive device. Such an ESD event could cause damage to occur in the electronic device due to, for example, localized overheating. Localized overheating may particularly occur at the interfaces associated with the electronic device, since the interfaces are first to come into contact with the electrostatic discharge. Of particular interest, are those electronic devices that are implemented on an Integrated Circuit (IC).

The current trend in IC design is to reduce component dimensions to improve performance characteristics such as parasitic delay, operational speed, and cost. Those same dimension reductions, however, may also contribute to ESD sensitivity. In particular, reduced device dimensions including shortened channel lengths, thinner gate oxide layers, and shallower junction depths may contribute to increased ESD sensitivity of the IC.

Depending on the type of IC interface and mode of operation, several conventional approaches have been devised to help mitigate the effects of ESD events. The simplest approach perhaps, is a resistor/capacitor (RC) combination placed at every driver output and receiver input on the IC, where a series connected resistor limits peak current caused by the ESD event, and a shunt capacitor limits short-term voltage peaks caused by the ESD event. Although the RC combination is relatively inexpensive, it only limits voltage slew rate, not peak voltage, and produces low pass filter (LPF) distortion, which among other detriments, reduces the maximum data rate possible.

Another conventional approach taken to mitigate ESD event damage utilizes an RC control circuit to activate a shunt device during an ESD event so that current resulting from the ESD event may be "shunted" away from the protected circuit. Often, transistors are used as resistive components to realize the RC control circuit, whereby one of the conductive terminals of the transistor is connected directly to the interface being protected and the other conductive terminal is connected to the node that produces the exponential waveform that is used to trigger the shunt device.

Under some circumstances, however, the shunt device may effect a differential voltage across the transistor, such that the parasitic, or body, diode that is intrinsic to the transistor becomes forward biased. Once forward biased, a low impedance path is formed through the body diode, whereby the transistor ceases to behave as a resistive component, thus causing a failure in the RC control circuit.

An apparatus and method that addresses the aforementioned problems, as well as other related problems, are therefore desirable.

SUMMARY OF THE INVENTION

To overcome limitations in the prior art, and to overcome other limitations that will become apparent upon reading and understanding the present specification, the present invention discloses a method and apparatus that maintains the bias potential of the bulk region of a resistively coupled transistor to prevent forward biasing of the body diode that is intrinsic to the transistor.

In accordance with one embodiment of the invention, an Electrostatic Discharge (ESD) protection circuit comprises a deactivation circuit that is coupled to receive an ESD signal and is adapted to generate a deactivation signal at a first node in response to the ESD signal. The deactivation circuit comprises a first transistor coupled to receive the ESD signal at a control terminal and at a first conduction terminal and a second transistor having a bulk region coupled to a second conduction terminal and a bulk region of the first transistor. The ESD protection circuit further comprises a control circuit that is coupled to receive the ESD and deactivation signals and is adapted to assert a control signal when a magnitude of the ESD signal exceeds a magnitude of the deactivation signal. The ESD protection circuit further comprises a clamp that is coupled to receive the control signal and is adapted to activate a conductive path for the ESD signal in response to the control signal.

In accordance with another embodiment of the invention, an Electrostatic Discharge (ESD) protection circuit comprises a means for using an active, predetermined resistance value to generate an exponentially increasing signal, a means for activating a conduction circuit to conduct an ESD signal when a magnitude of the ESD signal exceeds a magnitude of the exponentially increasing signal, and a means for maintaining a resistance value of the resistive element substantially equal to the predetermined resistance value when the conduction circuit is activated.

In accordance with another embodiment of the invention, a method of operating an Electrostatic Discharge (ESD) protection circuit comprises receiving an ESD signal, generating a deactivation signal in response to the ESD signal using a transistor adapted as a resistive element having a predetermined resistance, activating a conduction circuit when a magnitude of the ESD signal exceeds a magnitude of the deactivation signal, and maintaining a resistance value of the resistive element substantially equal to the predetermined resistance value during activation of the conduction circuit.

In accordance with another embodiment according to the invention, an Integrated Circuit (IC) contains an Input/Output (I/O) pin protection circuit. The I/O pin protection circuit comprises a deactivation circuit that is coupled to receive an I/O signal at the I/O pin and is adapted to generate a damped signal at a first node in response to the I/O signal. The deactivation circuit comprises a first transistor that is coupled to receive the I/O signal at a control terminal and at a first conduction terminal and a second transistor having a bulk region that is coupled to a second conduction terminal and a bulk region of the first transistor. The I/O pin protection circuit further comprises a control circuit that is coupled to receive the I/O and damped signal and is adapted to assert a control signal when a magnitude of the I/O signal exceeds a magnitude of the damped signal. The I/O pin protection circuit further comprises a clamp that is coupled to receive the control signal and is adapted to activate a conductive path for the I/O signal in response to the control signal.

It will be appreciated that various other embodiments are set forth in the Detailed Description and claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
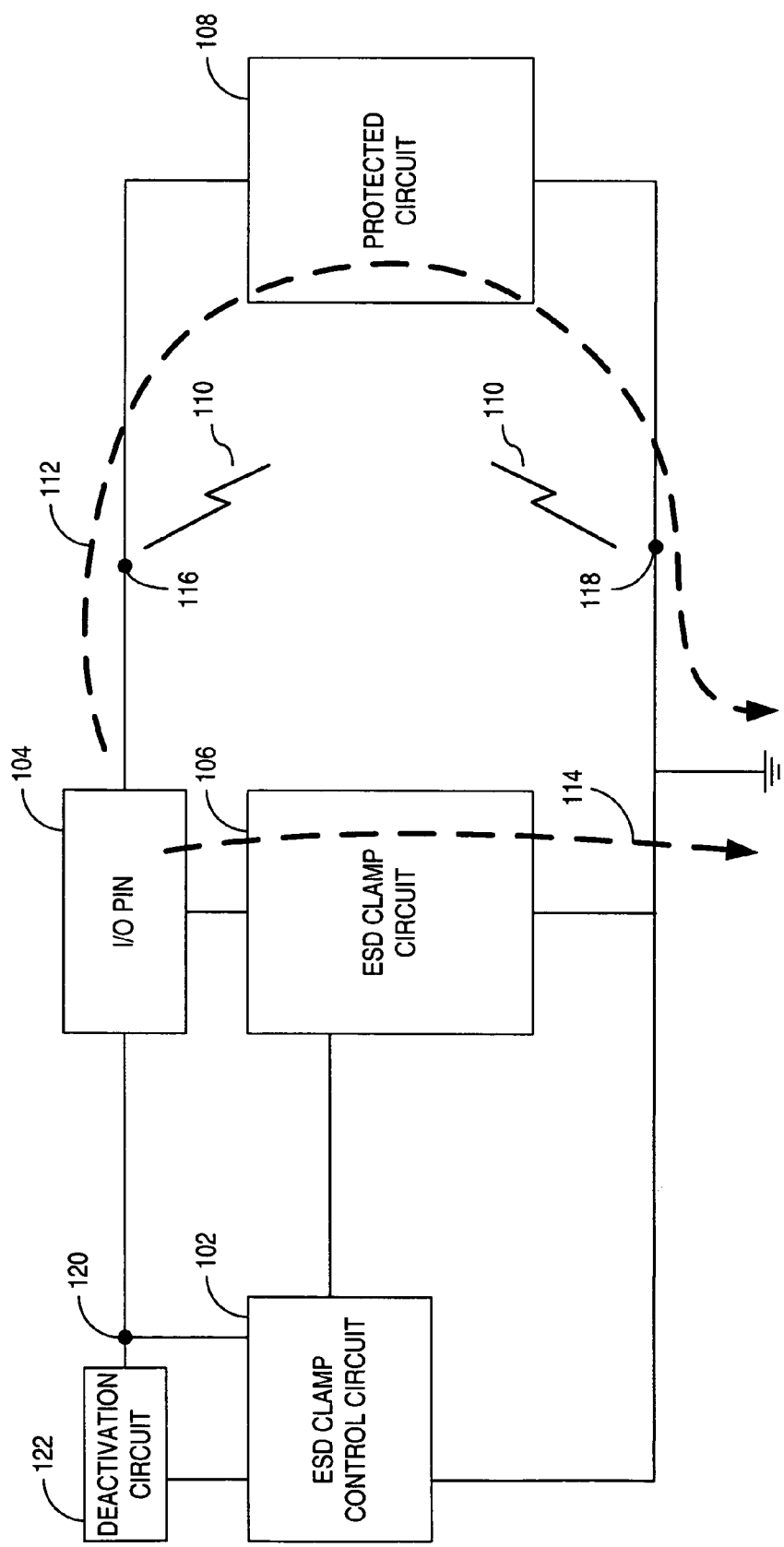
FIG. 1 illustrates an exemplary Electrostatic Discharge (ESD) event scenario.

Various embodiments of the present invention are described in terms of an ESD clamp circuit and associated RC control circuitry. The RC control circuitry of one embodiment of the present invention exhibits protection against forward bias of the parasitic, or body, diode that is intrinsic within a resistively coupled transistor. The resistively coupled transistor being used to realize the resistive component of the RC control circuit. Embodiments of an ESD clamp circuit according to the present invention are shown using complimentary P-type Field Effect Transistor (PFET) and N-type (NFET) topologies. Those skilled in the art will appreciate that the invention could be implemented in other circuit topologies, such as bipolar or bi-Complimentary Metal Oxide Semiconductor (biCMOS), circuit topologies.

Generally speaking, electrostatic charge associated with an object is stored within a capacitance associated with that object and may accumulate to an extremely high potential. The human body, for example, has an associated capacitance that is capable of storing up to 25 Kilovolts (KV) of electrostatic charge. When two objects having unequal amounts of stored electrostatic charge are brought within contact or proximity to each other, an ESD event may occur causing damage to one or both of the objects.

Basically, two categories of damage from such an ESD event may occur. First, catastrophic damage may occur, in which the object is rendered inoperable immediately after the ESD event. In the event that the catastrophically damaged object is an IC, a semiconductor junction or a connecting metallization within the IC, for example, may have been permanently damaged by the ESD event.

On the other hand, latent damage may occur, whereby the object appears to be normally operable immediately after the ESD event, but may fail to operate properly at some point in the future. The latent damage does not necessarily render the damaged device totally inoperable, but may instead result in diminished performance.

One example of latent damage effects caused by an ESD event is the unintended coupling of a received signal onto a subsequently transmitted signal. Such may be the case for example with an RS-232 serial device, whereby after an ESD event, inadmissible current paths exist within the RS-232 device, such that unintended coupling of received data energy onto transmitted data energy causes crosstalk or data errors.

Still other examples of latent ESD event damage may allow received RS-232 current to feed through to the power supply. In such an instance, if the power supply is unable to maintain its nominal output voltage by sinking this excess current, noise may be coupled onto other devices that derive their operational power from the power supply. Under extreme conditions, these devices may even be damaged by the over-voltage produced by the power supply.

An ESD sensitive device may be virtually any device susceptible to damage caused by an over-voltage condition. Most often, ESD event damage causes field and/or production failures at the interface connections of, for example, desktop computers, notebooks, modems, and other communication devices. ESD event damage may also occur in lower level electronic assemblies such as populated Printed Circuit Boards (PCBs), ICs, or even discrete components such as transistors and diodes.

An exemplary diagram of a typical ESD event scenario is depicted in FIG. 1. Protected circuit 108 may represent an ESD sensitive device being subjected to ESD event 110, which may represent a discharge of stored electrostatic charge from, for example, a technician performing assembly testing on protected circuit 108. ESD event 110 may be capable of creating a voltage differential between I/O pin 104 and system ground of many thousands of volts. In response to the sudden increase in potential, ESD surge current may flow in paths represented by path 112 and path 114.

In one embodiment of the present invention, ESD clamp circuit 106 and associated ESD clamp control circuit 102 operate at least to: minimize the amount of current flowing in path 112; and to maximize the amount of current flowing in path 114, during ESD event 110. In addition, ESD clamp circuit 106 is inoperative under normal operating conditions, i.e., in the absence of ESD event 110, such that protected circuit 108 may derive operational signals via path 112 for normal operation.

In one embodiment, ESD clamp control circuit 102 asserts a logic signal to the input of ESD clamp circuit 106 during an ESD event, such that ESD clamp circuit 106 activates during the ESD event to maximize the amount of current flowing via path 114. After an amount of time has elapsed, the output of ESD clamp control circuit 102 deasserts in response to a deactivation signal provided by deactivation circuit 122, such that the amount of current flowing in path 114 is substantially equal to zero. Thus, during the activation time of ESD clamp circuit 106, the amount of potentially destructive current flowing via path 112 is minimized.

Figure 3A:
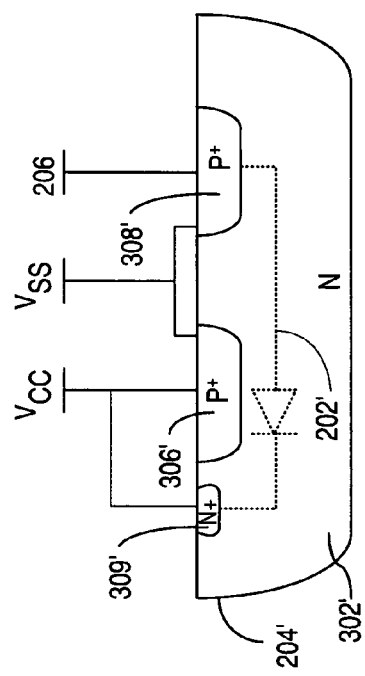
FIG. 3 illustrates an exemplary cross section view of active components contained within the ESD protection circuit of FIG. 2.

Under certain circumstances, ESD clamp circuit 106 may produce a potential at node 120 that is at a lower magnitude than a magnitude of the logic signal provided by deactivation circuit 122 to the input of ESD clamp control circuit 102. Depending upon the implementation of deactivation circuit 122 such as done in the prior art (see FIG. 3A), this differential voltage may invoke anomalous operation.

Figure 2:
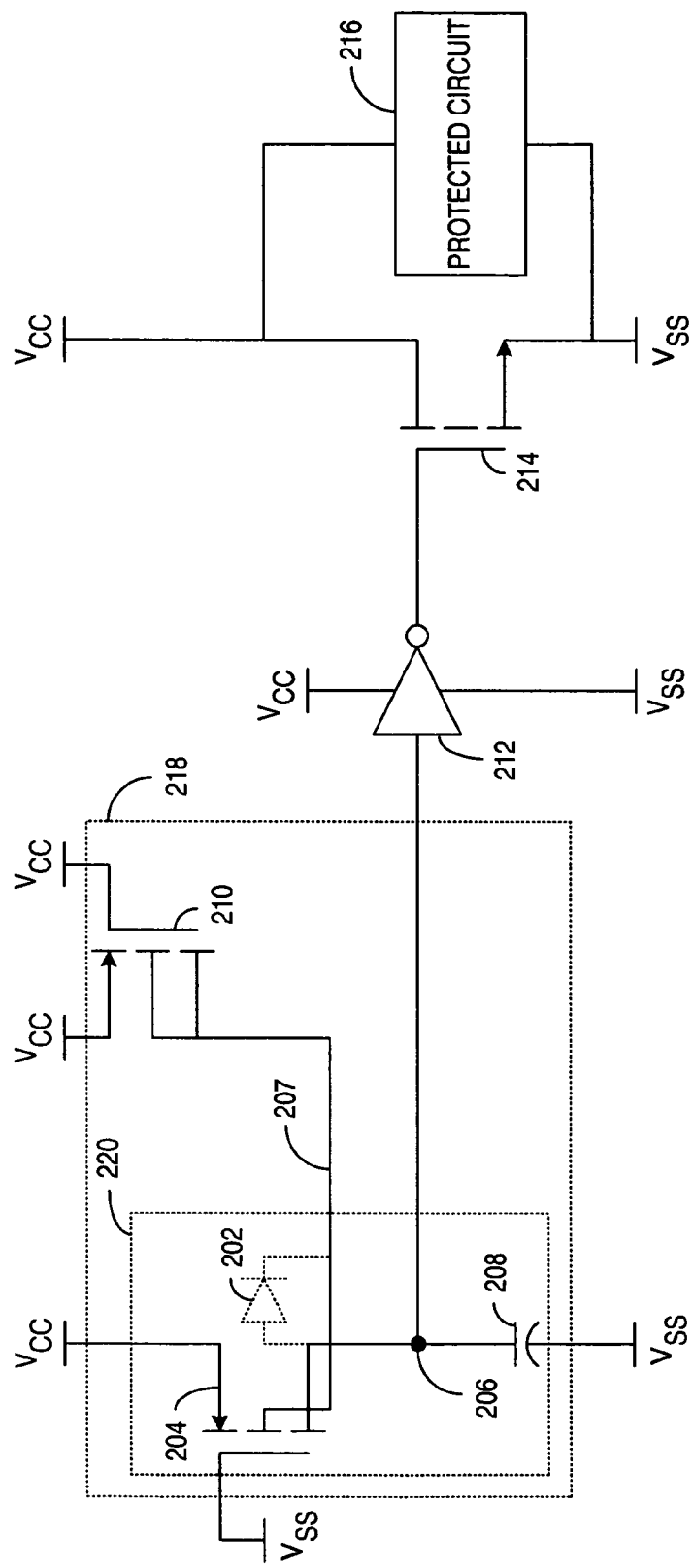
FIG. 2 illustrates an exemplary ESD protection circuit according to the present invention.

FIG. 2 illustrates an exemplary view of an ESD protection circuit according to the present invention, whereby the I/O pins under protection involve power supply terminals $V_{CC}$ and $V_{SS}$. ESD clamp circuit 214 is effective to "shunt" potentially damaging surge current caused by an ESD event away from protected circuit 216 depending upon the logic signal provided by the ESD clamp control circuit, e.g., inverter 212.

In operation, P-type transistor 204 forms a resistive component that combines with capacitor 208 to form damping circuit 220. Damping circuit 220 performs a damping function, which generates an exponential voltage at node 206 in response to the sudden increase in voltage across terminals $V_{CC}$ and $V_{SS}$ due to the ESD event. While the voltage at node 206 remains below the trigger voltage of inverter 212, the output of inverter 212 remains at a logic high value during the ESD event. Transistor 214 is then rendered conductive to pull potentially destructive ESD current away from protected circuit 216. After several RC time constants, the voltage at node 206 exceeds the trigger voltage of inverter 212, which toggles the output of inverter 212 to a logic low to render transistor 214 into a non-conductive state.

Traditionally, transistor 210 is absent and signal line 207 (from the substrate of transistor 204) is connected directly to $V_{CC}$, i.e., shorted to the source terminal of transistor 204. Thus in the past, resistively coupled transistor 204 may be effectively removed from damping circuit 220 under certain bias conditions. To more fully set forth the debilitating effects of adverse substrate biasing, transistor 204 is described in relation to its semiconductor cross-section as exemplified in FIG. 3A, where the fabrication of transistor 204' results in a built-in, anti-parallel diode, i.e., body diode 202', existing between the drain terminal 308' and the substrate 302', represented by N+region 309'. P$^+$ region 306' forms the source terminal of transistor 204', while P$^+$ region 308' forms the drain terminal of transistor 204'.

It is traditional practice to maintain the potential of bulk region 302' to be equivalent to the potential of source region 306' (i.e., shown in FIG. 3A by connecting N$^+$ region 309' to $V_{CC}$), by placing for example, a metallization layer (not shown) across source region 306' and bulk region 302'. It can be seen, however, that if the metallization layer were placed as described and the voltage at terminal $V_{CC}$ was pulled to a level that was less than the barrier potential of body diode 202' relative to node 206, then body diode 202' would be forward biased. Forward biasing body diode 202', however, renders transistor 204 as a low impedance device and, consequently, an ineffective resistive component of damping circuit 220.

Figure 4:
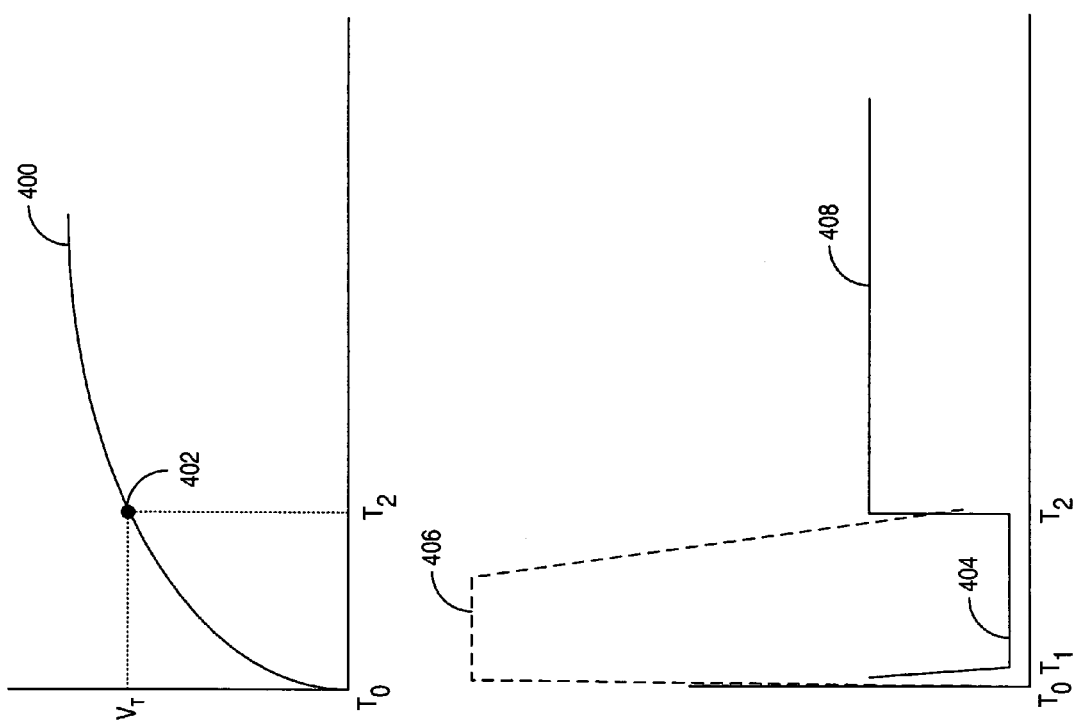
FIG. 4 illustrates exemplary voltage waveforms exemplifying the operation of the ESD protection circuit of FIG. 2.

In particular, body diode 202' may be forward biased during an ESD event as exemplified by FIG. 4. At time $T_0$, for example, an ESD event occurs, such that the voltage on terminal $V_{CC}$ quickly ramps to some large value, e.g., thousands of volts, as indicated by waveform 406. RC voltage 400 begins to exponentially form at node 206 in accordance with the RC time constant generated by damping circuit 220.

At time $T_1$, inverter 212 becomes operative, but the voltage at node 206 has not yet achieved the trigger voltage for inverter 212. Thus, the output of inverter 212 is at a logic high value, which transitions transistor 214 into a conductive state. Once transistor 214 is conductive, the voltage at terminal $V_{CC}$ is pulled down to level 404, which is substantially equal to the $V_{DS}$ of transistor 214.

Under some circumstances during the time between $T_1$ and $T_2$, however, the voltage 400 at node 206 could be at a larger magnitude than the clamped voltage 404 at terminal $V_{CC}$ due to operation of transistor 214. If this positive difference in potential exceeds the barrier potential of body diode 202, as discussed above, then in conventional RC triggered ESD clamp circuits, body diode 202 becomes forward biased, which creates a low impedance current path from node 206 to terminal $V_{CC}$.

In such an instance, transistor 204 ceases operation as a resistive element and essentially becomes a low impedance element, which adversely affects the RC time constant of damping circuit 220. In particular, once the resistance of transistor 204 is reduced to near zero, capacitor 208 charges much more quickly, thus decreasing the amount of time between $T_2$ and $T_0$. That is to say, that the amount of time that transistor 214 actually conducts potentially damaging ESD current away from protected circuit 216 is reduced.

Figure 3B:
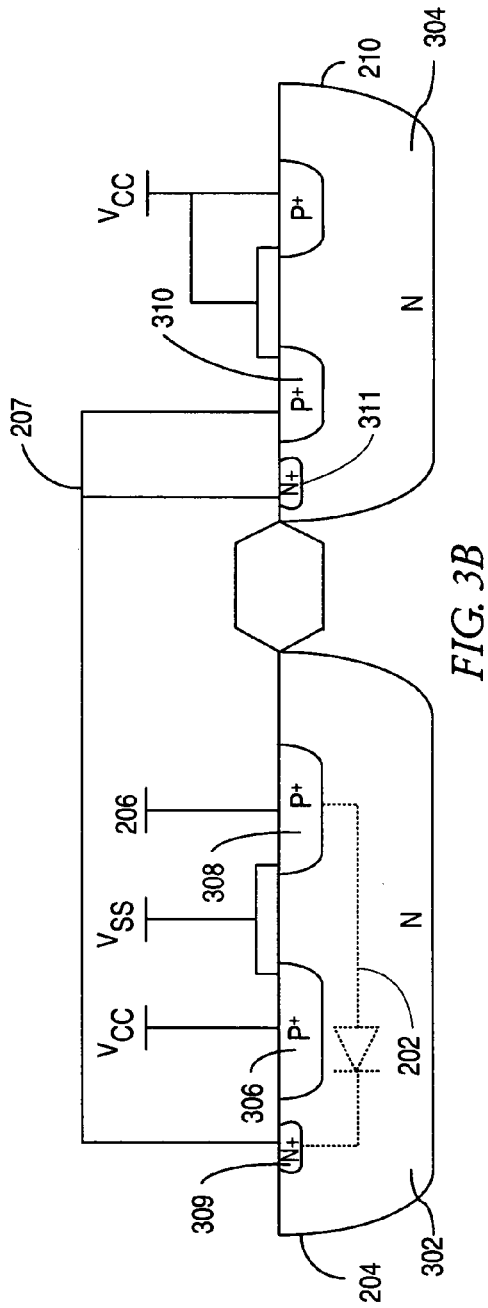

Accordingly, in one embodiment of the present invention, transistor 210 is constructed adjacent to transistor 204, as exemplified in FIG. 3B. As such, N-well 302 is biased using diode connected transistor 210 (shown in FIG. 3B by N$^+$ region 309 being connected to N$^+$ region 311 via signal line 207) instead of directly connecting N-well 302 to source region 306 as is conventionally done. Schematically, as exemplified in FIG. 2, the source and gate terminals of transistor 210 are connected to terminal $V_{CC}$, while the drain and bulk connections of transistor 210 are connected to the bulk connection of transistor 204 via signal line 207. Hence in one embodiment, the deactivation circuit 122 of FIG. 1 includes block 218 of FIG. 2, where block 218 includes transistors 204 and 210.

Thus, instead of equating the potential of N-well 302 to the potential existing at terminal $V_{CC}$, N-well 302 is rather set to a potential existing at terminal $V_{CC}$ plus a threshold voltage, $V_{TH}$, by connecting N-well 302 to N-well 304 and drain region 310, where $V_{TH}$, is the threshold voltage of transistor 210. In such an instance, the additional threshold voltage of transistor 210 extends the difference in voltage that is allowed to exist between node 206 and terminal $V_{CC}$ without unintentionally forward biasing body diode 202.

That is to say, that depending on the threshold voltage of transistor 210, the magnitude of the tolerable voltage difference between terminal 206 and terminal $V_{CC}$ may be determined. If the threshold voltage of transistor 210 is set low, for example, then the allowable difference voltage is decreased. If the threshold voltage of transistor 210 is set higher, on the other hand, then the allowable difference voltage is increased. Thus, transistor 210 acts as a resistance maintenance device, whereby the resistance of transistor 204 is substantially maintained at its predetermined value to allow proper operation of damping circuit 220 during the ESD event.

Returning to FIG. 4, a normal operation point (non-ESD clamp operation) of the ESD clamp control circuit of FIG. 2 has been reached at time $T_2$. In particular, RC voltage 402 at node 206 has increased to $V_T$, i.e., the trigger voltage of inverter 212, which causes the output of inverter 212 to deassert to a logic low value. Thus, the gate to source voltage of transistor 214 returns to near zero, which renders clamp transistor 214 non-conductive. Operational value 408 of the voltage present at terminal $V_{CC}$ is now ready for use by protected circuit 216 for normal operation.

It should be noted that under normal operating conditions, the voltage at terminal $V_{CC}$ rises slower than the RC time constant of damping circuit 220. Circuitry (not shown) within inverter 212 monitors the difference in voltage between terminal $V_{CC}$ and node 206. If the voltage on terminal $V_{CC}$ never exceeds the voltage at node 206 during power up, then the output of inverter 212 remains at a logic low level and transistor 214 is never rendered conductive. In other words, the ESD protection circuit of FIG. 2 is deactivated during the entire power up sequence under normal operating conditions.

The present invention is believed to be applicable in a variety of ESD protection applications. In particular, although the ESD protection circuits disclosed herein have been discussed in relation to IC applications, one of ordinary skill in the art will recognize relevant application in discrete applications as well. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An Electrostatic Discharge (ESD) protection circuit, comprising:
   a deactivation circuit coupled to receive an ESD signal and adapted to generate a deactivation signal at a first node in response to the ESD signal, the deactivation circuit including,
      a first transistor coupled to receive the ESD signal at a control terminal and at a first conduction terminal; and
      a second transistor having a bulk region coupled to a second conduction terminal and a bulk region of the first transistor;
   a control circuit coupled to receive the ESD and deactivation signals and adapted to assert a control signal when a magnitude of the ESD signal exceeds a magnitude of the deactivation signal; and
   a clamp coupled to receive the control signal and adapted to activate a conductive path for the ESD signal in response to the control signal.

2. The ESD protection circuit according to claim 1, wherein the second transistor further comprises a second conduction terminal coupled to the first node and a control terminal coupled to receive a reference signal.

3. The ESD protection circuit according to claim 2, wherein the deactivation circuit further comprises a capacitive element coupled to the first node, the capacitive element interacting with the second transistor to form the deactivation signal that exponentially increases with time.

4. The ESD protection circuit according to claim 1, wherein the control circuit comprises an inverter having an input coupled to the first node and an output coupled to a control terminal of the clamp.

5. An Electrostatic Discharge (ESD) protection circuit, comprising:
   means for using an active, predetermined resistance value to generate an exponentially increasing signal;
   means for activating a conduction circuit to conduct an ESD signal when a magnitude of the ESD signal exceeds a magnitude of the exponentially increasing signal; and
   means for maintaining a resistance value of the resistive element substantially equal to the predetermined resistance value when the conduction circuit is activated.

6. A method of operating an Electrostatic Discharge (ESD) protection circuit, comprising:
   receiving an ESD signal;
   generating a deactivation signal in response to the ESD signal using a transistor adapted as a resistive element having a predetermined resistance;
   activating a conduction circuit when a magnitude of the ESD signal exceeds a magnitude of the deactivation signal; and
   maintaining a resistance value of the resistive element substantially equal to the predetermined resistance value during activation of the conduction circuit.

7. The method according to claim 6, wherein generating the deactivation signal comprises generating an exponentially increasing voltage using the resistive element in combination with a capacitive element.

8. The method according to claim 7, further comprising deactivating the conduction circuit when the deactivation signal exceeds the ESD signal.

9. In an Integrated Circuit (IC), an Input/Output (I/O) pin protection circuit, comprising:
   a deactivation circuit coupled to receive an I/O signal at the I/O pin and adapted to generate a damped signal at a first node in response to the I/O signal, the deactivation circuit including,
      a first transistor coupled to receive the I/O signal at a control terminal and at a first conduction terminal; and
      a second transistor having a bulk region coupled to a second conduction terminal and a bulk region of the first transistor;
   a control circuit coupled to receive the I/O and damped signal and adapted to assert a control signal when a magnitude of the I/O signal exceeds a magnitude of the damped signal; and
   a clamp coupled to receive the control signal and adapted to activate a conductive path for the I/O signal in response to the control signal.

10. The I/O protection circuit according to claim 9, wherein the second transistor further comprises a second conduction terminal coupled to the first node and a control terminal coupled to receive a reference signal.

11. The I/O protection circuit according to claim 10, wherein the deactivation circuit further comprises a capacitive element coupled to the first node, the capacitive element interacting with the second transistor to form the damped signal that exponentially increases with time.

12. The ESD protection circuit according to claim 9, wherein the control circuit comprises an inverter having an input coupled to the first node and an output coupled to a control terminal of the clamp.

* * * * *